(12) United States Patent
Kaviani

(10) Patent No.: US 6,466,052 B1
(45) Date of Patent: Oct. 15, 2002

(54) IMPLEMENTING WIDE MULTIPLEXERS IN AN FPGA USING A HORIZONTAL CHAIN STRUCTURE

(75) Inventor: Alireza S. Kaviani, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/858,991

(22) Filed: May 15, 2001

(51) Int. Cl.$^7$ ............................................. H03K 19/177
(52) U.S. Cl. ............................ 326/41; 326/38; 326/39; 326/40; 326/47
(58) Field of Search .............................. 326/38, 39, 40, 326/41, 47

(56) References Cited

U.S. PATENT DOCUMENTS

| | | | | |
|---|---|---|---|---|
| 5,724,276 A | * | 3/1998 | Rose et al. .................. 708/235 |
| 5,889,411 A | * | 3/1999 | Chandhary .................. 326/39 |
| 5,920,202 A | | 7/1999 | Young et al. | |
| 6,118,300 A | * | 9/2000 | Wittig et al. .................. 326/41 |
| 6,204,690 B1 | * | 3/2001 | Young et al. .................. 326/39 |

OTHER PUBLICATIONS

"The Programmable Logic Data Book 2000", published in 2000, available from Xilinx, Inc., 2100 Logic Drive, San Jose, CA 95124, pp. 3–75 to 3–96.

"Virtex–II Platform FPGA Handbook"; 2001; available from Xilinx, Inc. 2100 Logic Drive, San Jose, CA 95124; pp. 33–75.

* cited by examiner

*Primary Examiner*—Michael G. Lee
*Assistant Examiner*—Steven S. Paik
(74) *Attorney, Agent, or Firm*—Lois D. Cartier

(57) ABSTRACT

Methods and structures for implementing wide multiplexers in programmable logic devices (PLDs) in a distributed fashion. According to one embodiment, a configurable logic structure includes a function generator, a carry multiplexer, and an OR gate. The function generator is configured to implement a multiplexing function (under control of a first select signal) and an AND function (ANDing the output of the multiplexer with a second select signal). The carry multiplexer is configured to perform an AND function between an output of the function generator and a third select signal. Thus, with three select signals available, an 8-to-1 multiplexer can be implemented by combining the outputs of four different logic structures that use different values of the select signals. This combination of outputs is performed by forming an OR chain, with the OR input of each stage being provided by the associated carry multiplexer.

20 Claims, 9 Drawing Sheets

IMPLEMENTING WIDE MULTIPLEXERS IN AN FPGA USING A HORIZONTAL CHAIN STRUCTURE

FIELD OF THE INVENTION

The invention relates to Field Programmable Gate Arrays (FPGAs). More particularly, the invention relates to a structure and method for implementing wide multiplexers in an FPGA using a horizontal chain structure.

BACKGROUND OF THE INVENTION

Programmable logic devices (PLDs) are a well-known type of digital integrated circuit that may be programmed by a user to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. The CLBs, IOBs, and interconnect are typically programmed by loading a stream of configuration data (bitstream) into internal configuration memory cells that define how the CLBs, IOBs, and interconnect are configured. The configuration data may be read from memory (e.g., an external PROM) or written into the FPGA by an external device. The collective states of the individual memory cells then determine the function of the FPGA.

One such FPGA, the Xilinx Virtex® FPGA, is described in detail in pages 3–75 through 3–96 of the Xilinx 2000 Data Book entitled "The Programmable Logic Data Book 2000" (hereinafter referred to as "the Xilinx Data Book"), published April, 2000, available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

The Virtex CLB is composed of two similar elements called "slices", as described by Young et al. in U.S. Pat. No. 5,920,202 and shown in FIGS. 4A and 4B therein. (U.S. Pat. No. 5,920,202 is hereby incorporated herein by reference.) These figures are reproduced in FIGS. 1A and 1B of the present specification. Young et al. describe the figures in detail, therefore, the description is not repeated here.

FIG. 2 is a simplified drawing of the Virtex CLB of FIGS. 1A and 1B, showing how the F5 and F6 multiplexers of the two slices can be interconnected to implement wide functions. The two slices are designated SA and SB. Included in FIG. 2 are the four 4-input function generators F, G, H, J. The outputs of function generators F and G (F' and G', respectively) are combined with a fifth independent input BFF in multiplexer F5B to produce output F5B', which can be any function of five inputs, or some functions of up to nine inputs. (In the present specification, the same reference characters are used to refer to terminals, signal lines, and their corresponding signals.) The outputs of function generators H and J (H' and J', respectively) are combined with a fifth independent input BHH in multiplexer F5A to produce output F5A', which can be any function of five inputs, or some functions of up to nine inputs.

The outputs F5A' and F5B' of multiplexers F5A and F5B are combined with a sixth independent input BGG in multiplexer F6B, and with a different sixth independent input BJJ in multiplexer F6A. The two multiplexers F6A and F6B therefore produce two outputs F6A' and F6B', respectively. One of outputs F6A' and F6B' can be any function of six inputs; the other output can be any function of six inputs provided that five inputs are shared between the two 6-input functions. Some functions of up to nineteen inputs can also be generated in a single CLE.

As described above, the four 4-input function generators F, G, H, J shown in FIGS. 1A, 1B, and 2 can each be used to implement any function of up to four inputs. Therefore, each function generator can implement one 2-to-1 multiplexer. The F and G function generators and the F5B multiplexer can together implement a 4-to-1 multiplexer. Similarly, the outputs of the H and J function generators can be combined in the F5A multiplexer to implement another 4-to-1 multiplexer. The four function generators, the two F5 multiplexers, and one of the F6 multiplexers can together implement an 8-to-1 multiplexer.

However, this multiplexer implementation is limiting in that the entire multiplexer is implemented as a compact block instead of as a distributed structure. In some applications, it is desirable to implement a multiplexer in such a fashion that the floorplan matches the layout of other circuits in the application. Thus, for applications such as datapaths and ALUs, for example, it is desirable to implement a wide multiplexer as a structure distributed along a horizontal chain of slices. Further, the fact that carry chains are often implemented in a vertical fashion means that a horizontal multiplexer would be efficient in emulating the internal busses that are often used in datapaths, ALUs, and other ordered circuit structures. Therefore, it is desirable to provide structures and methods for implementing multiplexers along a horizontal chain of logic elements in an FPGA.

SUMMARY OF THE INVENTION

The invention provides methods and structures for implementing wide multiplexers in programmable logic devices (PLDs) such as Field Programmable Gate Arrays (FPGAs). According to a first embodiment, a configurable logic structure includes a function generator, a carry multiplexer, and an OR gate. The function generator is configured to implement a multiplexing function (under control of a first select signal) and an AND function (ANDing the output of the multiplexer with a second select signal). By ANDing the output of the multiplexer with the second select signal, a second level of multiplexing can be added by selectively setting the values of the second select signal in different ones of the logic structures. The carry multiplexer is configured to perform an AND function between an output of the function generator and a third select signal. Again, various values of the third select signal can be used on different ones of the logic structures. Thus, with three select signals available, an 8-to-1 multiplexer can be implemented by combining the outputs of four different logic structures that use different values of the select signals. This combination of outputs is performed by forming an OR chain, with the OR input of each stage being provided by the associated carry multiplexer. The OR input of the first stage is a logic low value; the OR output of the final stage is the output of the wide multiplexer function.

As will be clear to those of ordinary skill in the art of PLD design, the 8-to-1 multiplexer described herein is purely exemplary, and wide multiplexers of virtually any size can be formed using the structures and methods of the invention. The described multiplexer is merely selected as being particularly suited to implementation in the Virtex-II FPGA architecture from Xilinx, Inc., where a distributed 8-to-1 multiplexer can be implemented in four function generators.

The distributed multiplexing function of the invention has advantages for certain applications having structured layouts, such as ALUs and other datapath functions. For example, the distributed structure of the invention allows the emulation of internal busses used within the application. Also, having a multiplexer structure distributed along with the related logic can reduce path delays. Further, the number of CLBs required to implement many user designs is reduced, because (in one embodiment) only a portion of the logic within the configurable logic structure is used. The unused resources are still available to implement other user functions.

Another advantage of the described embodiment is that each circuit element used to implement the multiplexing function has another use for which it was primarily designed. The carry multiplexer is primarily used to implement carry chains. The OR gate is primarily used to perform a Sum-Of-Products function. Therefore, in the preferred embodiment, no extra circuitry need be added to the CLB to enable the invention.

A second aspect of the invention comprises methods for implementing wide multiplexing circuits in PLDs. According to one embodiment, a wide multiplexing circuit comprising a plurality of multiplexing structures is implemented by: configuring a function generator of each multiplexing structure to implement a first multiplexer; implementing a carry multiplexer of each multiplexing structure as an AND gate performing an AND function between the output of the first multiplexer and an external select signal; and configuring an OR gate of each multiplexing structure to form an OR chain to combine the outputs of the various carry multiplexers. The output of the last OR gate in the chain is the output of the wide multiplexing circuit.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

As described above, the Virtex CLB includes F5 and F6 multiplexers that enable the implementation of multiplexers with up to 8 data inputs in a single CLB. The Virtex-II FPGA architecture carries this idea one step further, by increasing the number of slices in a single CLB to four, and enabling the implementation of multiplexers with up to 16 data inputs in a single CLB. This functionality is enabled by configurably interconnecting the four F5 multiplexers and the four F6 multiplexers (now called "FX" multiplexers) to implement "F7" and "F8" multiplexers. The F7 multiplexer can implement a 7-input function or a 16-to-1 multiplexer, and consumes one CLB. The F8 multiplexer can implement an 8-input function or a 32-to-1 multiplexer, and consumes two CLBs. The Xilinx Virtex-II FPGA is described in detail in pages 33–75 of the "Virtex-II Platform FPGA Handbook", published January, 2001, available from Xilinx, Inc., which pages are incorporated herein by reference. The F5, F6, F7, and F8 multiplexers are shown on page 52 of this document.

However, even with these wide multiplexers available, the multiplexers are implemented as compact blocks of logic, rather than being distributed in a linear fashion. As described above, it is desirable to have the capability to implement distributed multiplexers.

Figure 3A:
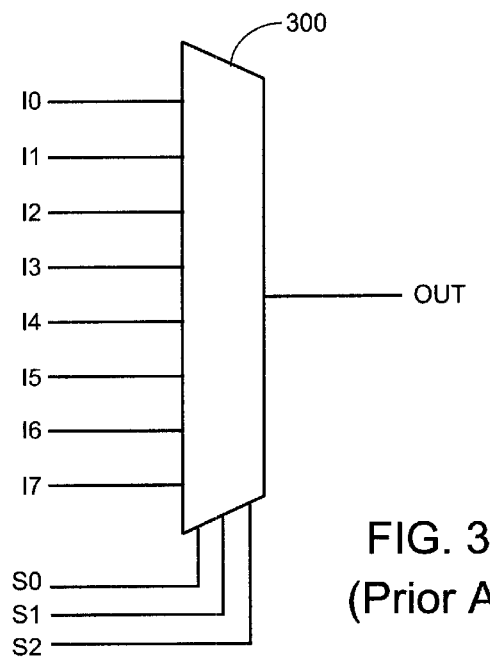
FIG. 3A is a diagram showing an 8-to-1 multiplexer.
Figure 3B:
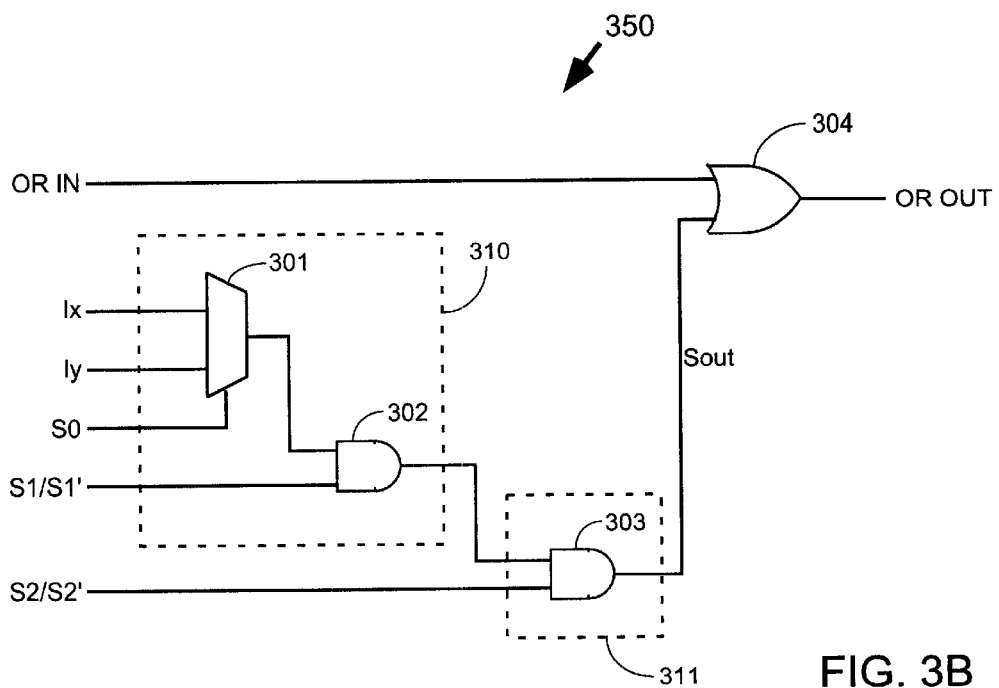
FIG. 3B schematically illustrates how a wide multiplexer such as the multiplexer of FIG. 3A can be implemented using a distributed OR structure.

FIG. 3A is a block diagram showing an 8-to-1 multiplexer 300 having eight data inputs I0–I7, three select inputs S0–S2, and one output OUT. FIG. 3B shows a circuit for implementing one stage 350 of a distributed multiplexer that can be used to implement multiplexer 300. Because each stage 350 accepts two data inputs Ix, Iy, only four stages 350 are required to implement multiplexer 300.

In brief, the multiplexer is implemented using a distributed OR function, with a series of OR gates 304 being coupled in series along the length of the distributed circuit (one OR gate per stage). Thus, an OR chain is formed, flowing from the OR IN terminal to the OR OUT terminal of each stage. The initial OR input (OR IN of the leftmost stage) is a logic low level. Moving along the chain to the right, at each stage, if either of the data inputs Ix and Iy is high and is also selected by the select inputs S0–S2, then the stage output signal Sout is high. This high value is then placed on the chain through OR gate 304, and each value on the OR chain from that point on is high. On the other hand, if the selected value is low (or if no Ix or Iy data value is selected), then the output of the OR chain is low. Thus, the functionality of the OR chain implementation is that of a multiplexer.

More particularly, select signal S0 controls multiplexer 301 to select one of data inputs Ix, Iy. The selected data value is passed to AND gate 302. If the selected data value is high, and if the S1/S1' signal is also high (i.e., if the stage is selected by the S1 signal), then AND gate 302 provides a high level to AND gate 303. If the selected value provided by AND gate 302 is high, and if the s2/S2' signal is also high (i.e., if stage is selected by the S2 signal), then AND gate 303 provides a high level as the stage output signal (Sout). Thus, each subsequent value on the OR chain is also high.

Note that the single stage shown in FIG. 3B could be implemented in a programmable logic device (PLD) using a 4-input function generator (portion 310), an AND gate or a 2-input function generator (portion 311) and an OR gate 304.

Figure 3C:
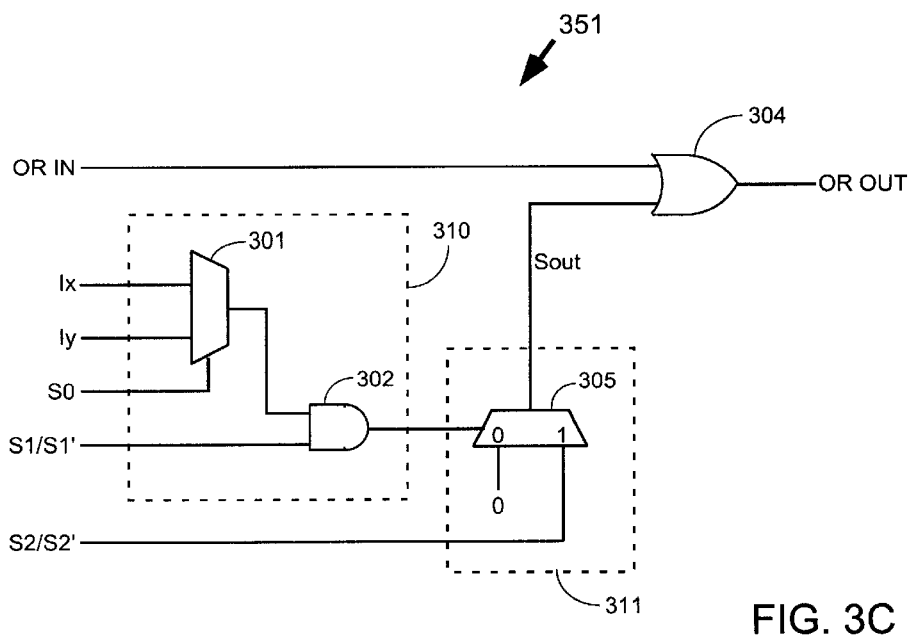
FIG. 3C schematically illustrates how the multiplexer of FIGS. 3A and 3B can be implemented using a distributed OR structure and a carry multiplexer.

FIG. 3C shows another implementation of a distributed multiplexer, with portion 311 of the multiplexer stage 351 being implemented using a 2-to-1 multiplexer 305. (Other portions of the circuit are the same as in FIG. 3B, and therefore are not described.) AND gate 302 provides the select input for multiplexer 305. The data inputs of multiplexer 305 are the S2/S2' signal and the logic low signal ("0"). The output of the multiplexer is the Sout signal, where the Sout signal has the same logic value as the Sout signal in the circuit of FIG. 3B.

When the output of AND gate 302 is high (i.e., when the data value selected by the S0 signal is high, and the S1 signal also selects the stage), then multiplexer 305 passes the S2/S2' signal to OR gate 304. Thus, if the stage is selected by the S2 signal, the Sout value is high. If the stage is not selected by the S2 signal, the Sout value is low. On the other hand, when the output of AND gate 302 is low (i.e., when either the value selected by signal S0 is low or the stage is not selected by the S1 signal), then multiplexer 305 passes the logic low level to OR gate 304.

Multiplexer 300 of FIG. 3A can be implemented, for example, by coupling together a series of eight stages 351 of FIG. 3C, with properly selected values of Ix, Iy, S0, S1/S1', and S2/S2'. One possible set of such values is shown in Table 1. In one implementation, Stage 3 is the leftmost stage, and Stage 0 is the rightmost stage. However, because each stage is uniquely addressed by the select signals, the stages can be in any order.

TABLE 1

| Stage | Ix | Iy | S0 | S1/S1' | S2/S2' |
|---|---|---|---|---|---|
| 3 | I0 | I1 | S0 | S1' | S2' |
| 2 | I2 | I3 | S0 | S1 | S2' |
| 1 | I4 | I5 | S0 | S1' | S2 |
| 0 | I6 | I7 | S0 | S1 | S2 |

Figure 1A:
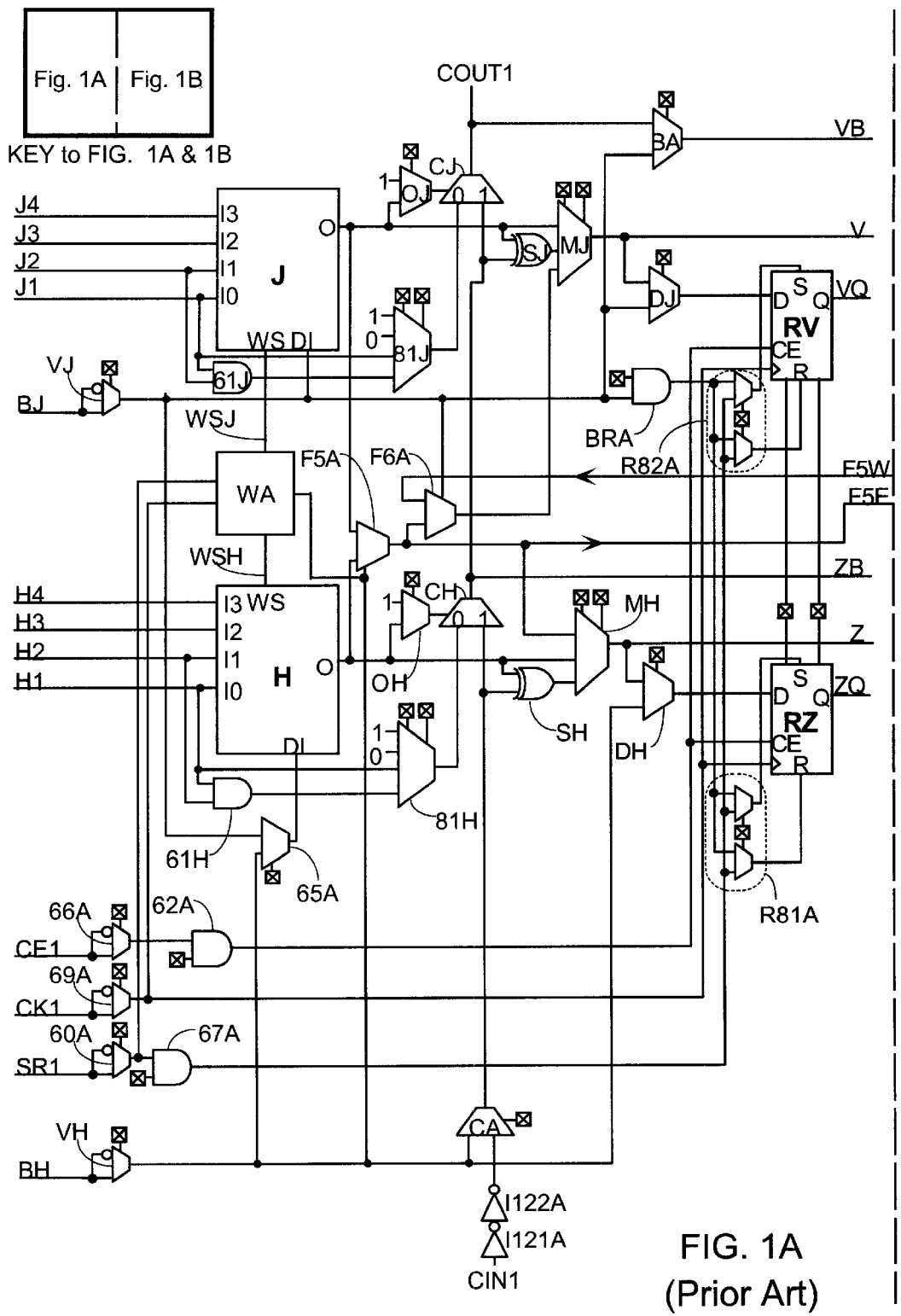
FIG. 1A schematically illustrates the left slice of a Virtex CLB, which comprises two slices.
Figure 1B:
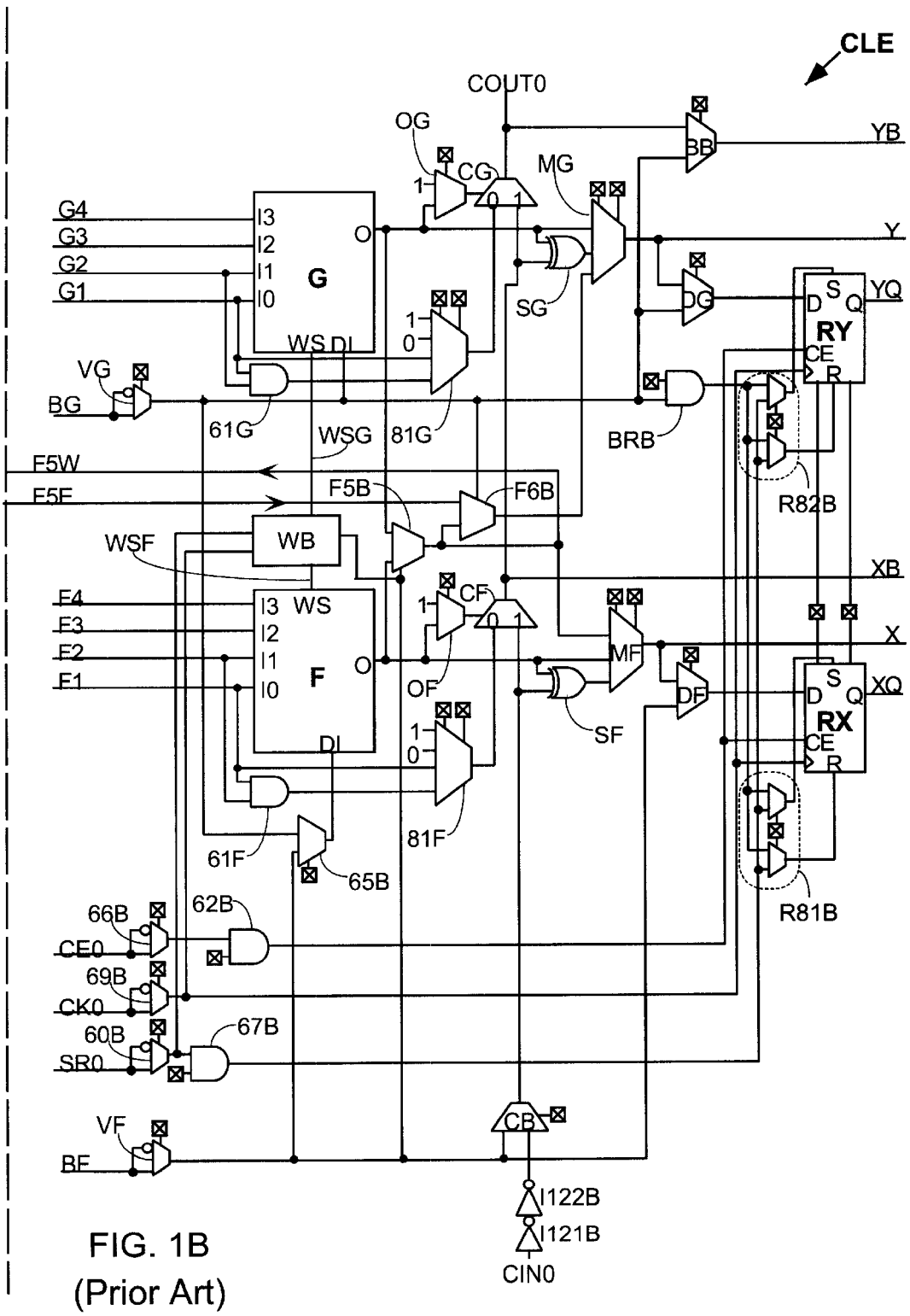
FIG. 1B schematically illustrates the right slice of a Virtex CLB.
Figure 2:
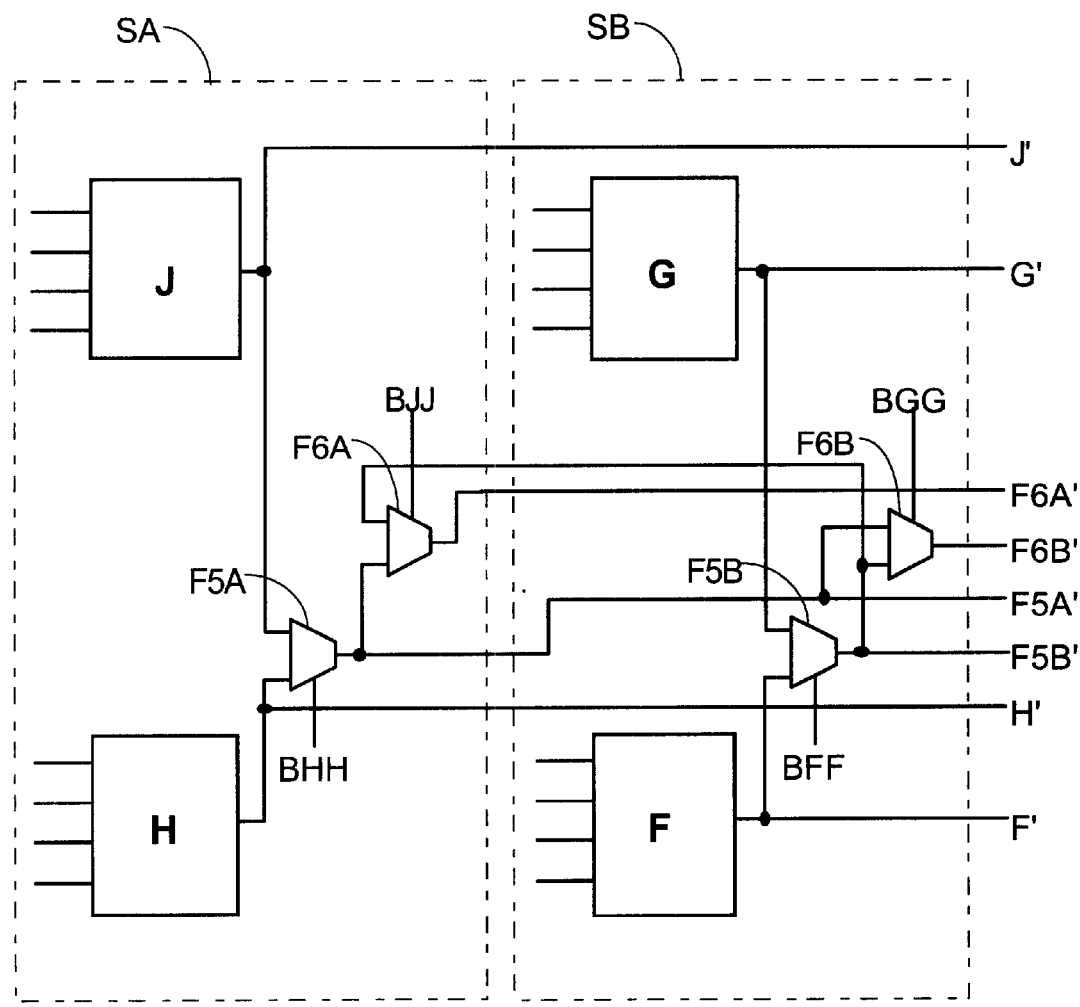
FIG. 2 is a simplified drawing of a Virtex CLB including two slices, showing the function generators and F5, F6 multiplexers that can be used to implement multiplexers with up to eight data inputs.
Figure 4:
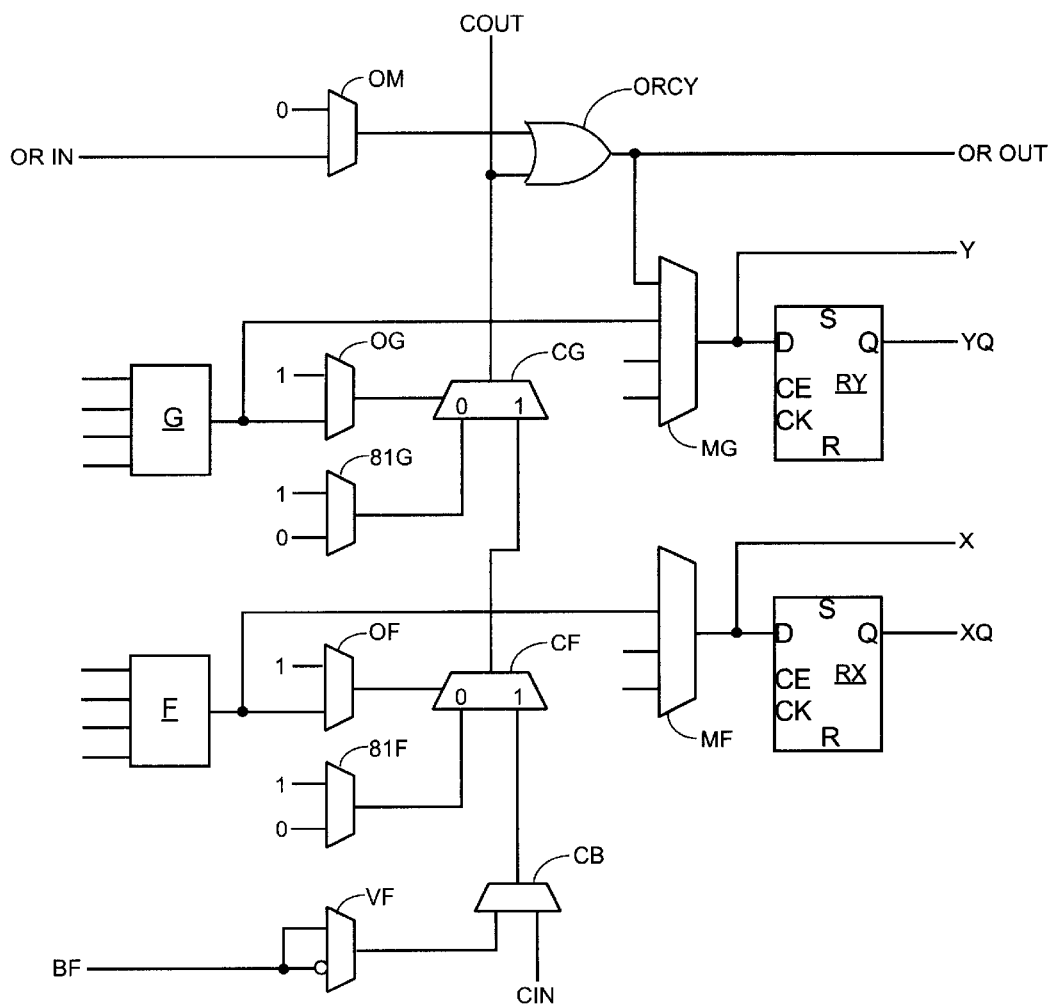
FIG. 4 is a simplified drawing of a single Virtex-II slice, showing the vertical carry chain and the "ORCY" OR-gate that can be used to implement wide multiplexers according to one embodiment of the present invention.

FIG. 4 shows a simplified Virtex-II slice, one PLD logic element in which the distributed multiplexer of FIG. 3C can be implemented. Many of the circuit elements in the slice are the same as those of the Virtex slice shown in FIGS. 1A and 1B. The slice comprises two 4-input function generators F and G. Each function generator F, G drives the select input of one carry multiplexer (CF, CG, respectively) through a multiplexer OF, OG. Multiplexers OF, OG can also optionally supply a "1" value to the select input of the associated carry multiplexer CF, CG. The two carry multiplexers CF, CG are coupled in series to form a carry chain between terminals CIN and COUT. The "0" data terminal of each carry multiplexer CF, CG is supplied by a configurable multiplexer (81F, 81G, respectively) that programmably supplies either a "1" or a "0" logic level to the associated carry multiplexer. These multiplexers 81F, 81G can be used to initiate the carry chain with either a high or a low value. The function generator F, G output signals are also supplied to associated output multiplexers MF, MG, which optionally provide the signals to output terminals X, Y and/or registers RX, RY. Registers RX, RY supply registered output signals to terminals XQ, YQ, respectively.

In addition to these elements from the Virtex slice, the Virtex-II slice also provides additional elements that can advantageously be used to implement a distributed multiplexer according to the invention. These additional elements are OR gate ORCY and the multiplexer OM providing one of the data input signals to OR gate ORCY. The other input to OR gate ORCY is the carry out signal COUT. Multiplexer OM programmably provides to OR gate ORCY either the output of ORCY from the previous slice (to the left in FIG. 4), or a "0" logic level.

The ORCY OR gate is provided in the Virtex-II slice for implementing sum-of-products functions. However, the ORCY OR gate can also be used to implement the distributed multiplexer circuit shown in FIG. 3C, as shown in FIG. 5.

Figure 5:
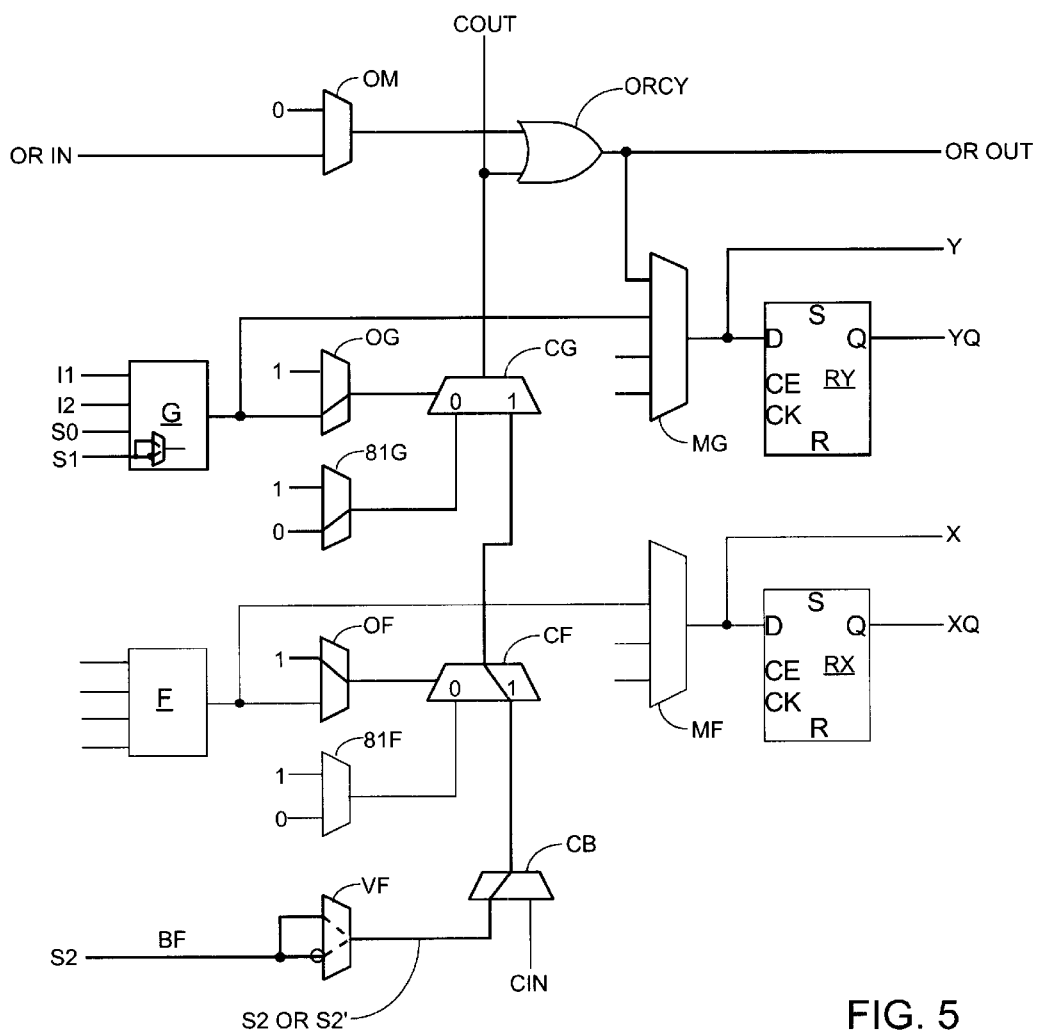
FIG. 5 is a simplified drawing of the Virtex-II slice of FIG. 4, configured as a portion of an 8-to-1 multiplexer according to one aspect of the present invention.

As shown in FIG. 5, one stage of the distributed multiplexer of the invention is implemented in the Virtex-II slice using only one function generator (the G function generator in the implementation of FIG. 5), the carry chain and the elements thereon, and the ORCY OR gate and its associated multiplexer OM. (In another embodiment, the OM multiplexer is not included, and a logic low signal is supplied to the OR IN input terminal to initiate the OR chain.) Multiplexer 305 (see FIG. 3C) is implemented in carry multiplexer CG. Portion 310 of the circuit is implemented in function generator G. Note that the inversion of select signal S1 can be implemented as part of the function generator. Therefore, it is not necessary to provide both true and complement versions of select signal S1. Select signal S2 can be optionally inverted in multiplexer VF. Function generator F remains unused and is available for the implementation of additional user logic.

Figure 6:
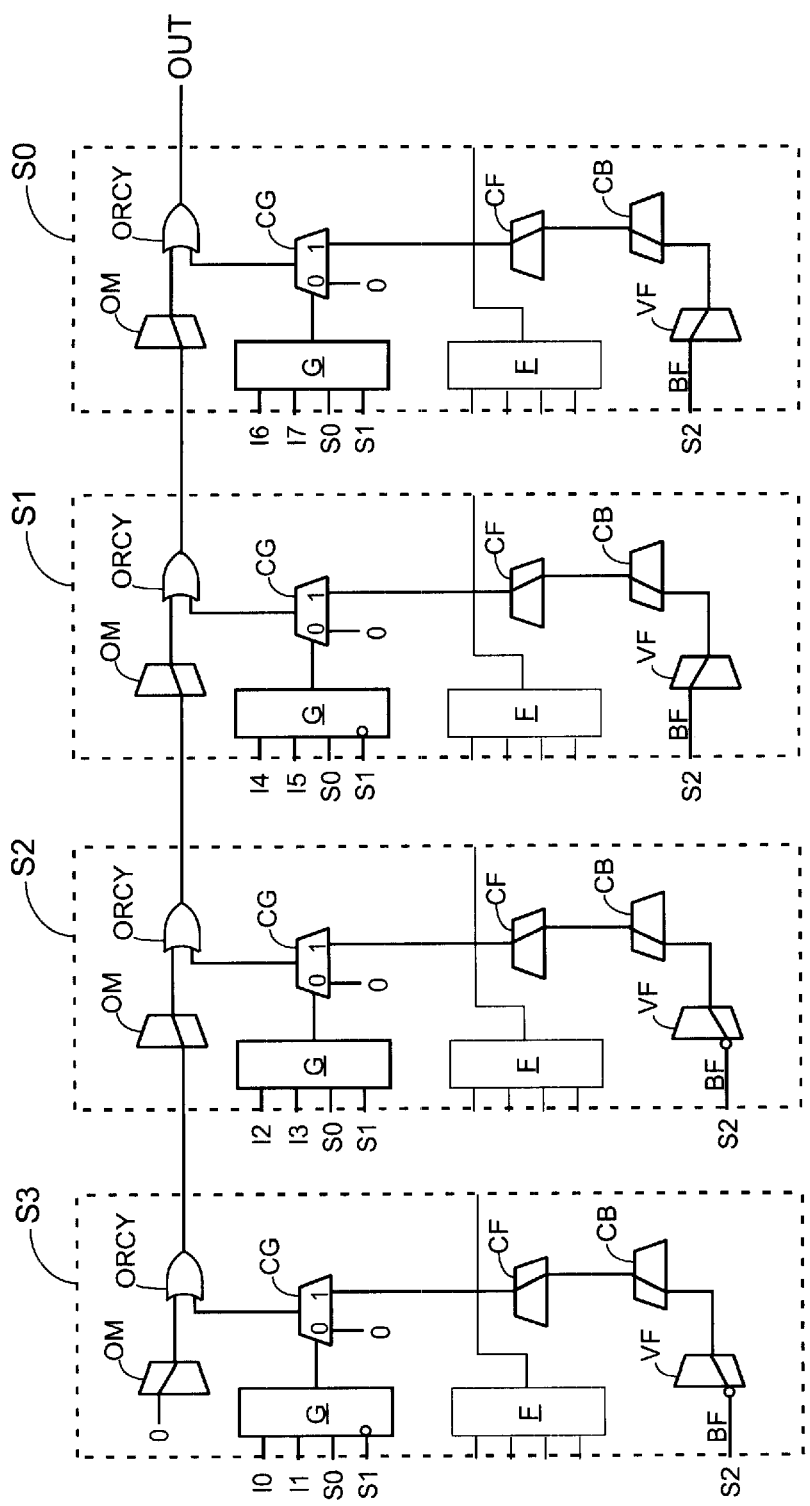
FIG. 6 is a simplified drawing of four Virtex-II slices configured as an 8-to-1 multiplexer according to one aspect of the present invention.

FIG. 6 shows how four copies of the multiplexer stage of FIG. 5 can be combined to implement an 8-to-1 distributed multiplexer in four Virtex-II slices. Note that the data values and select signal values are assigned as shown in Table 1, above. The select signal inversions are denoted by "bubbles" on the function generator inputs.

Figure 7:
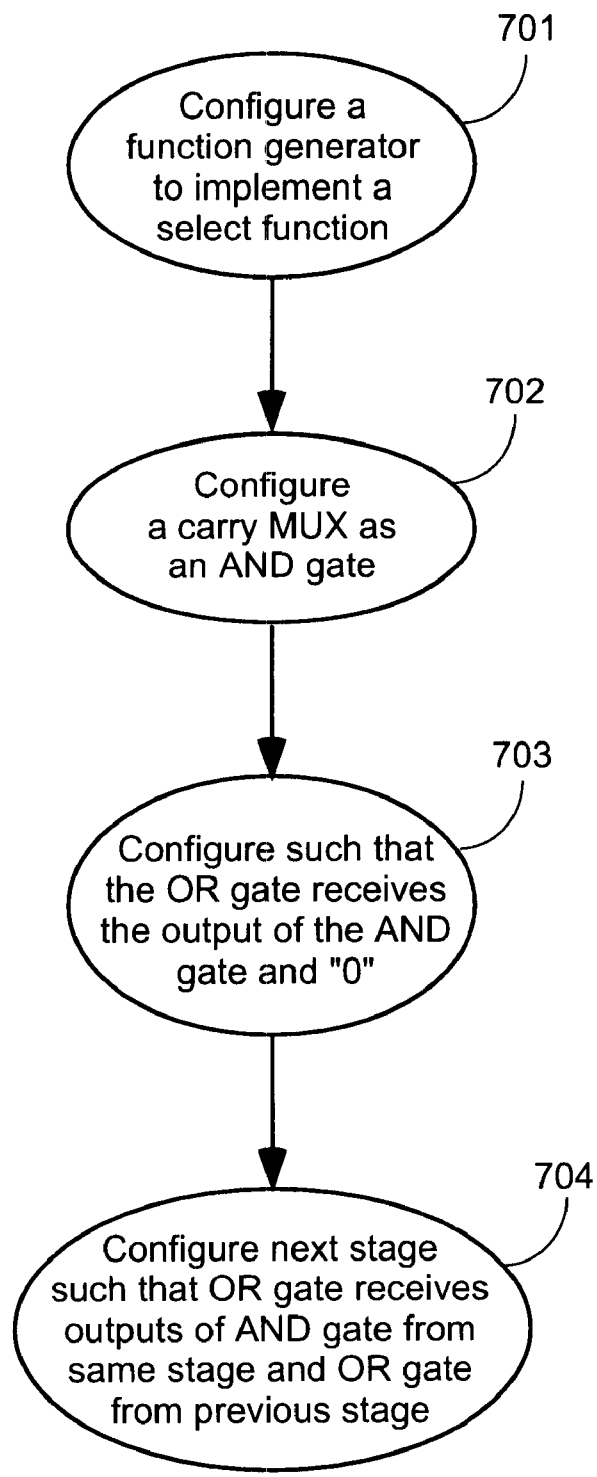
FIG. 7 is a flow chart illustrating the steps of a method for implementing a wide multiplexing circuit in a PLD according to another aspect of the present invention.

FIG. 7 is a flow diagram showing the steps of a method for implementing a wide multiplexing circuit in a PLD according to one embodiment of the invention. The order of the steps shown is exemplary, as the steps can be performed in any order. In step 701, a function generator in a first multiplexing structure (e.g., in a first stage of the wide multiplexing circuit) is configured to implement a select function. For example, portion 310 of FIG. 3C is implemented using a 4-input function generator in an FPGA. In step 702, a carry multiplexer in the first multiplexing structure is configured to implement an AND gate. The carry multiplexer is configured to be controlled by an output of the first multiplexer, and also to select between a logic zero value and an externally-supplied select signal (e.g., see portion 311 of FIG. 3C). In step 703, the first multiplexing structure is configured such that the OR gate receives the output of the AND gate and a logic low value. In step 704, another multiplexing structure of the wide multiplexing circuit is configured such that the OR gate receives the AND output signal from the same multiplexing structure and an output of the OR gate in the previous multiplexing structure.

Those having skill in the relevant arts of the invention will now perceive various modifications and additions that may be made as a result of the disclosure herein. For example, the above text describes the multiplexer of the invention in the context of FPGAs. However, the invention can also be applied to other programmable logic devices (PLDs), such as mask programmable devices (e.g., Application Specific ICs (ASICs)), and devices in which only a portion of the logic is programmable.

Further, multiplexers, multiplexing circuits, carry multiplexers, carry chains, AND gates, OR gates, function generators, slices, CLBS, FPGAs, and PLDs other than those described herein can be used to implement the invention. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art. Further, although an 8-to-1 multiplexer is shown herein as a preferred embodiment, the invention can also be applied to multiplexers of other sizes. Accordingly, all such modifications and additions are deemed to be within the scope of the invention, which is to be limited only by the appended claims and their equivalents.

What is claimed is:

1. A configurable logic structure implementing a multiplexer circuit in a programmable logic device (PLD), the configurable logic structure comprising:

a function generator having a plurality of input terminals and an output terminal, the function generator being configured to perform a select function between signals on at least two of such input terminals under control of at least a first select signal on another such input terminal and to provide a result of the select function to the output terminal;

a carry multiplexer having:
a select terminal configurably coupled to the output terminal of the function generator,
a carry in terminal configurably coupled to a carry out terminal of a first another carry multiplexer in a first another configurable logic structure, and further configurably coupled to receive a second select signal from a source external to the configurable logic structure, and
a carry out terminal configurably coupled to a carry in terminal of a second carry multiplexer in a second another configurable logic structure; and an OR circuit having:
a first input terminal coupled to the carry out terminal of the carry multiplexer,
an OR input terminal configurably coupled to an OR output terminal of a first another OR circuit in a third another configurable logic structure, and
an OR output terminal configurably coupled to an OR input terminal of a second another OR circuit in a fourth another configurable logic structure, wherein the first and second another configurable logic structures are each adjacent to the configurable logic structure in a first dimension, and wherein the third and fourth another configurable logic structures are each adjacent to the configurable logic structure in a second dimension orthogonal to the first dimension.

2. The configurable logic structure of claim 1, wherein the PLD comprises a Field Programmable Gate Array (FPGA).

3. The configurable logic structure of claim 2, wherein the configurable logic structure forms a portion of a configurable logic block (CLB) in the FPGA.

4. The configurable logic structure of claim 3, wherein the CLB comprises four such configurable logic structures.

5. The configurable logic structure of claim 1, wherein the multiplexer circuit implements an 8-to-1 multiplexing function.

6. A wide multiplexing circuit implemented in a programmable logic device (PLD), the wide multiplexing circuit comprising a plurality of multiplexing structures, each multiplexing structure comprising:

a function generator configured to implement a select function;

a carry multiplexer configured to implement an AND gate, the carry multiplexer being controlled by an output of the function generator and selecting between a logic zero value and an externally-supplied select signal to provide an AND output signal; and an OR gate coupled to receive the AND output signal and an OR input signal, and further coupled to provide an OR output signal, wherein:
in a first such multiplexing structure the OR input signal is configured to be a logic low value and the OR output signal is provided to a next such multiplexing structure,
in subsequent such multiplexing structures the OR input signal is received from a previous such multiplexing structure and the OR output signal is provided to another next such multiplexing structure, and
in a last such multiplexing structure the OR input signal is received from another previous such multiplexing structure and the OR output signal provides an output of the wide multiplexing circuit.

7. The wide multiplexing circuit of claim 6, wherein the plurality of multiplexing structures are all adjacent.

8. The wide multiplexing circuit of claim 6, wherein each carry multiplexer forms a portion of a carry chain extending in a first dimension, and each OR gate forms a portion of an OR chain extending in a second dimension, the second dimension being orthogonal to the first dimension.

9. The wide multiplexing circuit of claim 6, wherein the wide multiplexing circuit implements an 8-to-1 multiplexing function.

10. The wide multiplexing circuit of claim 6, wherein the PLD comprises a Field Programmable Gate Array (FPGA).

11. The wide multiplexing circuit of claim 10, wherein each multiplexing structure is implemented in a portion of a configurable logic block (CLB) in the FPGA.

12. The wide multiplexing circuit of claim 10, wherein:
the wide multiplexing circuit comprises four such multiplexing structures,
each CLB comprises four slices, and
each multiplexing structure is implemented in at least a portion of one slice.

13. A method for implementing a wide multiplexing circuit in a programmable logic device (PLD), the wide multiplexing circuit comprising a plurality of multiplexing structures each comprising a function generator, a carry multiplexer, and an OR gate, the method comprising:

configuring the function generator of each multiplexing structure to implement a select function;

configuring the carry multiplexer of each multiplexing structure as an AND gate, by configuring the carry multiplexer to be controlled by an output of the function generator and further configuring the carry multiplexer to select between a logic zero value and an externally-supplied select signal to provide an AND output signal;

configuring a first multiplexing structure such that an OR gate receives the AND output signal of the first multiplexing structure and a logic low value; and configuring each of the remaining multiplexing structures such that the OR gate receives the AND output signal of the corresponding multiplexing structure and an output of the OR gate in another multiplexing structure.

14. The method of claim 13, wherein configuring each of the remaining multiplexing structures comprises configuring the remaining multiplexing structures such that the OR gate receives an output of the OR gate in an adjacent multiplexing structure.

15. The method of claim 13, wherein each carry multiplexer forms a portion of a carry chain extending in a first dimension, and configuring each of the remaining multiplexing structures comprises forming an OR chain extending in a second dimension, the second dimension being orthogonal to the first dimension.

16. The method of claim 13, wherein the wide multiplexing circuit implements an 8-to-1 multiplexing function.

17. The method of claim 13, wherein the PLD comprises a Field Programmable Gate Array (FPGA).

18. The method of claim 17, wherein each multiplexing structure is implemented in a portion of a configurable logic block (CLB) in the FPGA.

19. The method of claim 18, wherein:

the wide multiplexing circuit comprises four such multiplexing structures, each CLB comprises four slices, and each multiplexing structure is implemented in at least a portion of one slice.

20. The method of claim 13, wherein the steps of the method are performed in the order recited.

* * * * *